United States Patent
He et al.

(10) Patent No.: US 10,217,953 B2
(45) Date of Patent: Feb. 26, 2019

(54) QUANTUM DOT LIGHT-EMITTING DEVICE, FABRICATING METHOD THEREOF, AND DISPLAY SUBSTRATE

(71) Applicant: BOE Technology Group Co., Ltd., Beijing (CN)

(72) Inventors: Yuedi He, Beijing (CN); Boris Kristal, Beijing (CN); Yanzhao Li, Beijing (CN); Jie Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/539,315

(22) PCT Filed: Nov. 30, 2016

(86) PCT No.: PCT/CN2016/107830
§ 371 (c)(1),
(2) Date: Jun. 23, 2017

(87) PCT Pub. No.: WO2017/140159
PCT Pub. Date: Aug. 24, 2017

(65) Prior Publication Data
US 2018/0053907 A1    Feb. 22, 2018

(30) Foreign Application Priority Data

Feb. 18, 2016 (CN) .......................... 2016 1 0091388
Apr. 15, 2016 (CN) .......................... 2016 1 0237544

(51) Int. Cl.
*H01L 51/50*  (2006.01)
*H01L 21/02*  (2006.01)
(Continued)

(52) U.S. Cl.
CPC ........ *H01L 51/502* (2013.01); *H01L 51/5028* (2013.01); *H01L 51/56* (2013.01);
(Continued)

(58) Field of Classification Search
CPC ............. H01L 51/502; H01L 21/02601; Y10S 977/774
See application file for complete search history.

(56) References Cited

U.S. PATENT DOCUMENTS 7,858,962 B2 * 12/2010 Smith .................... B82Y 20/00
                                                                257/13
7,863,813 B2 *  1/2011 Park ...................... C09K 11/612
                                                                313/502
(Continued)

FOREIGN PATENT DOCUMENTS

CN         104835916 A      8/2015
CN         105199724 A     12/2015
(Continued)

OTHER PUBLICATIONS

Mar. 3, 2017—(WO) International Search Report and Written Opinion Appn PCT/CN2016/107830 with English Tran.
(Continued)

*Primary Examiner* — Ida M Soward
(74) *Attorney, Agent, or Firm* — Banner & Witcoff, Ltd.

(57) ABSTRACT

A quantum dot light-emitting device, a fabricating method thereof, and a display substrate are provided. The quantum dot light-emitting device includes: a base substrate; a first electrode layer, a light-emitting layer, a second electrode layer and an encapsulation layer which are sequentially formed on the base substrate, wherein the light-emitting layer includes a quantum dot light emitting material; a fluorescent material is disposed between the first electrode layer and the second electrode layer, and the fluorescent material includes a thermally activated delayed fluorescence (TADF) material; one of the first electrode layer and the second electrode layer is an anode layer, and the other of the first electrode layer and the second electrode layer is a cathode layer.

17 Claims, 2 Drawing Sheets

(51) Int. Cl.
  *H01L 51/56* (2006.01)
  *H01L 51/00* (2006.01)
(52) U.S. Cl.
  CPC .... *H01L 21/02601* (2013.01); *H01L 51/0067* (2013.01); *H01L 51/5056* (2013.01); *H01L 51/5072* (2013.01); *H01L 51/5088* (2013.01); *H01L 51/5092* (2013.01); *H01L 51/5096* (2013.01); *Y10S 977/774* (2013.01)

(56) References Cited

U.S. PATENT DOCUMENTS

| | | | | |
|---|---|---|---|---|
| 7,902,748 | B2* | 3/2011 | Cok | B82Y 20/00 313/506 |
| 8,043,793 | B2* | 10/2011 | Iizumi | H05B 33/10 428/195.1 |
| 8,242,515 | B2* | 8/2012 | Kahen | C09K 11/883 257/79 |
| 8,581,230 | B2* | 11/2013 | Kim | H01L 51/5262 257/13 |
| 9,147,855 | B2* | 9/2015 | Zhang | H01L 51/5092 |
| 9,203,215 | B2* | 12/2015 | Makino | H01S 5/18311 |
| 9,224,963 | B2* | 12/2015 | Li | H01L 51/0087 |
| 9,379,344 | B2* | 6/2016 | Yang | H01L 51/5036 |
| 9,419,174 | B2* | 8/2016 | Zheng | H01L 33/40 |
| 9,492,681 | B2* | 11/2016 | Aydt | A61F 9/00834 |
| 9,673,410 | B2* | 6/2017 | Kim | H01L 33/06 |
| 9,722,198 | B2* | 8/2017 | Murayama | C09K 11/565 |
| 9,853,184 | B2* | 12/2017 | Coe-Sullivan | H01L 33/06 |
| 9,991,471 | B2* | 6/2018 | Watabe | C07F 15/0033 |
| 2009/0233327 | A1* | 9/2009 | Lau | B03C 11/00 435/29 |
| 2010/0237322 | A1* | 9/2010 | Okada | H01L 51/5012 257/13 |
| 2013/0200334 | A1 | 8/2013 | Zhang et al. | |
| 2014/0339437 | A1 | 11/2014 | Aziz | |
| 2015/0076469 | A1* | 3/2015 | Ikemizu | C09K 11/88 257/40 |
| 2016/0062178 | A1* | 3/2016 | Kim | G02B 1/005 349/106 |

FOREIGN PATENT DOCUMENTS

| | | |
|---|---|---|
| CN | 105226159 A | 1/2016 |
| CN | 105276526 A | 1/2016 |
| CN | 105870347 A | 8/2016 |
| WO | 2009081918 A1 | 7/2009 |

OTHER PUBLICATIONS

Nov. 11, 2016—(CN) First Office Action Appn 201610237544.9 with English Tran.
Dec. 29, 2016—(CN) Second Office Action Appn 201610237544.9 with English Tran.
Feb. 28, 2017—(CN) Third Office Action Appn 201610237544.9 with English Tran.
Feb. 6, 2017—(CN) First Office Action Appn 201610091388.X with English Tran.
Sep. 22, 2016 (CN) Search Report Appn 201610237544.9 with English Tran.

* cited by examiner

QUANTUM DOT LIGHT-EMITTING DEVICE, FABRICATING METHOD THEREOF, AND DISPLAY SUBSTRATE The application is a U.S. National Phase Entry of International Application No. PCT/CN2016/107830 filed on Nov. 30, 2016, designating the United States of America and claiming priority to Chinese Patent Application Nos. 201610091388.X filed on Feb. 18, 2016 and 201610237544.9 filed on Apr. 15, 2016. The present application claims priority to and the benefit of the above-identified applications and the above-identified applications are incorporated by reference herein in their entirety.

TECHNICAL FIELD

Embodiments of the present disclosure relate to a quantum dot light-emitting device, a fabricating method thereof, a display substrate and a display apparatus.

BACKGROUND

Quantum dots have a semiconductor nanostructure that binds the conduction band electrons, valence band holes and excitons in three spatial directions. For example, the quantum dots may be nanoparticles composed of elements IIB and VIA or elements IIIA to VA. The particle size of the quantum dots generally ranges from about 1 nm to about 10 nm. Due to quantum confinement of the electrons and holes, the continuous band structure becomes a discrete energy level structure with molecular characteristics, and the quantum dots can be excited to emit fluorescence. Based on a quantum effect, quantum dots have wide potential applications in the fields such as solar cells, light-emitting devices and optical biomarkers. Scientists have invented many different ways to fabricate quantum dots, and such nanomaterials are expected to have great potential in the application of nano-electronics in twenty-first century.

The quantum dot electroluminescent devices mainly have two excitation mechanisms: one is direct injection of carriers, that is, injection of holes from a hole transport layer to a quantum dot light-emitting layer, and injection of electrons from an electron transport layer to the quantum dot light-emitting layer, and combining the holes and the electrons in the quantum dot light-emitting layer to form excitons and emit light; the other is by means of energy transfer, that is, direct transfer of the energy from excitons formed in the transport layer to the quantum dots results in emitting light.

A typical quantum dot light-emitting diode structure comprises a hole injection layer, a hole transport layer, an electron transport layer, and a quantum dot light-emitting layer, and the materials of the electron transport layer, the hole transport layer and the hole injection layer may be organic small molecules, organic polymers or inorganic metal oxides. However, because the valence band of the quantum dots is far below the highest occupied molecular orbital (HOMO) level of the hole transport layer, the injection ability of the holes is poor, which leads to the imbalance of the carriers and further leads to current leakage and degradation of devices, and thus the light-emitting efficiency and the lifetime of the devices are affected.

SUMMARY

At least one embodiment of the present disclosure provides a quantum dot light-emitting device which comprises: a base substrate; a first electrode layer, a light-emitting layer, a second electrode layer and an encapsulation layer which are sequentially formed on the base substrate, wherein the light-emitting layer comprises a quantum dot light emitting material; a fluorescent material is disposed between the first electrode layer and the second electrode layer, and the fluorescent material comprises a thermally activated delayed fluorescence material; one of the first electrode layer and the second electrode layer is an anode layer, the other of the first electrode layer and the second electrode layer is a cathode layer.

In the quantum dot light-emitting device provided by the present disclosure, for example, the quantum dot light-emitting device satisfies at least one of the following two conditions: the fluorescent material is codoped with the quantum dot light-emitting material to form the light-emitting layer; and the fluorescent material forms an energy transfer layer at one side or both sides of the light emitting layer, and the energy transfer layer is in contact with the light emitting layer.

In the quantum dot light-emitting device provided by the present disclosure, for example, the fluorescent material is composed of a single thermally activated delayed fluorescence material.

In the quantum dot light-emitting device provided by the present disclosure, for example, the thermally activated delayed fluorescence material is 2,4,5,6-tetrakis(carbazol-9-yl)-1,3-dicyanobenzene (4CzIPN).

In the quantum dot light-emitting device provided by the present disclosure, for example, the thermally activated delayed fluorescence material is a mixture comprising a host material and a guest material.

In the quantum dot light-emitting device provided by the present disclosure, for example, the fluorescent material further comprises a fluorescent material having no thermally activated delayed fluorescence characteristic.

In the quantum dot light-emitting device provided by the present disclosure, for example, the host material comprises at least one of 4,5-bis(carbazol-9-yl)-1,2-dicyanobenzene (2-CzPN), (3'-(4,6-diphenyl-1,3,5-triazine-2-yl)-(1,1'-biphenyl)-3-yl)-9-carbazole (3-CzTRZ) and 2,5-bis(carbazol-9-yl)-1,4-dicyanobenzene (CzTPN); the guest material comprises at least one of DFDB-QA and DMeDB-QA; and the fluorescent material having no thermally activated delayed fluorescence characteristic comprises 4,4'-bis(N-carbazolyl)-1,1'-biphenyl (DBP).

In the quantum dot light-emitting device provided by the present disclosure, for example, at least a portion of a fluorescence emission spectrum of the thermally activated delayed fluorescence material overlaps an absorption spectrum of the quantum dot light emitting material, and the overlap area accounts for not less than 30% of an area of the fluorescence emission spectrum of the guest material.

In the quantum dot light-emitting device provided by the present disclosure, for example, the quantum dot light-emitting material comprises at least one kind of red quantum dots, green quantum dots and blue light quantum dots.

In the quantum dot light-emitting device provided by the present disclosure, for example, the maximum luminous wavelength of the red quantum dots ranges from about 550 nm to about 650 nm, the maximum luminous wavelength of the green quantum dots ranges from about 480 nm to about 550 nm, and the maximum luminous wavelength of the blue quantum dots ranges from about 400 nm to about 480 nm.

In the quantum dot light-emitting device provided by the present disclosure, for example, the quantum dot light-emitting material is a zinc sulfide material with a core/shell structure.

In the quantum dot light-emitting device provided by the present disclosure, for example, the surface of the quantum dot light-emitting material is provided with a ligand which is selected from a group consisting of a phosphate ligand, a thiol ligand and a carboxylic acid ligand.

In the quantum dot light-emitting device provided by the present disclosure, for example, the thermally activated delayed fluorescence material forms an energy transfer layer at one side or both sides of the light-emitting layer; the energy transfer layer is in contact with the light-emitting layer; and the energy transfer layer has a thickness of from about 3 nm to about 80 nm.

In the quantum dot light-emitting device provided by the present disclosure, for example, the quantum dot light-emitting device further comprises at least one of the following two structures:
a hole injection layer, a hole transport layer and a hole blocking layer which are sequentially disposed between the anode layer and the light-emitting layer; and
an electron injection layer, an electron transport layer and an electron blocking layer which are sequentially disposed between the cathode layer and the light-emitting layer.

In the quantum dot light-emitting device provided by the present disclosure, for example, the base substrate is an array substrate, and the anode layer is electrically connected with a switch element of the array substrate.

At least one embodiment of the present disclosure further provides a method for fabricating a quantum dot light-emitting device, and the method comprises: providing a base substrate; forming a first electrode layer, a light-emitting layer, a second electrode layer and an encapsulation layer sequentially on the base substrate; wherein the light-emitting layer comprises a quantum dot light emitting material; and the method further comprises disposing a fluorescent material between the first electrode layer and the second electrode layer; wherein the fluorescent material comprises a thermally activated delayed fluorescence material; one of the first electrode layer and the second electrode layer is an anode layer, and the other of the first electrode layer and the second electrode layer is a cathode layer.

In the method for fabricating the quantum dot light-emitting device provided by the present disclosure, for example, disposing a fluorescent material between the first electrode layer and the second electrode layer comprises at least one of the following two conditions:
the fluorescent material is codoped with the quantum dot light-emitting material to form the light-emitting layer; and
the fluorescent material forms an energy transfer layer at one side or both sides of the light emitting layer, and the energy transfer layer is in contact with the light emitting layer.

At least one embodiment of the present disclosure further provides a display substrate, and the display substrate comprises the above-mentioned quantum dot light-emitting devices which are arranged in an array.

At least one embodiment of the present disclosure further provides a display apparatus which comprises the above-mentioned display substrate.

BRIEF DESCRIPTION OF THE DRAWINGS

In order to clearly illustrate the technical solutions of the embodiments of the present disclosure, the drawings of the embodiments will be briefly described in the following. It is apparent that the described drawings are only related to some embodiments of the present disclosure and thus are not limitative on the disclosure.

DETAILED DESCRIPTION

Figure 1:
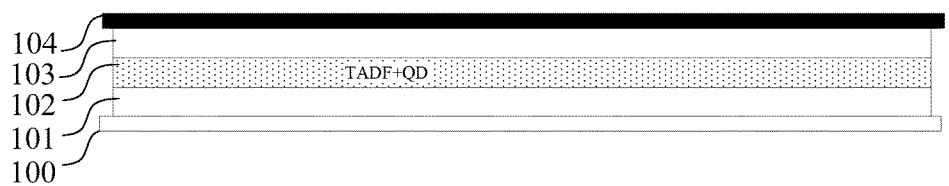
FIG. 1 is a schematic structure diagram of an OLED device provided by an embodiment of the present disclosure.

In order to make objects, technical details and advantages of the embodiments of the disclosure apparent, the technical solutions of the embodiments will be described in a clearly and fully understandable manner in connection with the drawings. It is obvious that the described embodiments are just a part of but not all of the embodiments of the disclosure. Based on the described embodiments herein, those skilled in the art can, without any inventive work, obtain other embodiments, which should be within the protection scope of the present invention.

Unless otherwise defined, all the technical and scientific terms used herein have the same meanings as commonly understood by one of ordinary skill in the art to which the present invention belongs. The terms "first", "second", etc., which are used in the description and the claims of the present application, are not intended to indicate any sequence, amount or importance, but distinguish various components. Also, the terms such as "a" and "an" are not intended to limit the amount, but indicate existence of at least one.

The structures of the compounds involved in the present disclosure are as follows:

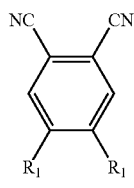

2-CzPN
2CzPN $R_1 =$

3-CzTRZ: (3'-(4,6-diphenyl-1,3,5-triazin-2-yl)-(1,1'-biphenyl)-3-yl)-9-carbazole

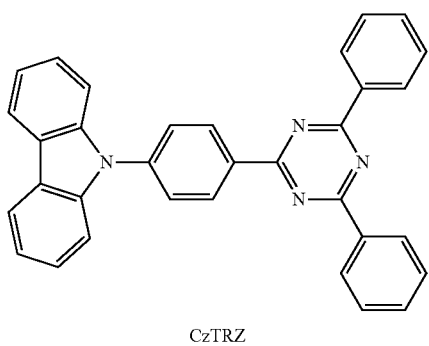 [SMILES: c1ccc(-c2nc(-c3ccccc3)nc(-c3ccc(-n4c5ccccc5c5ccccc54)cc3)n2)cc1]

CzTRZ

CzTPN: 2,5-bis(carbazol-9-yl)-1,4-dicyanobenzene

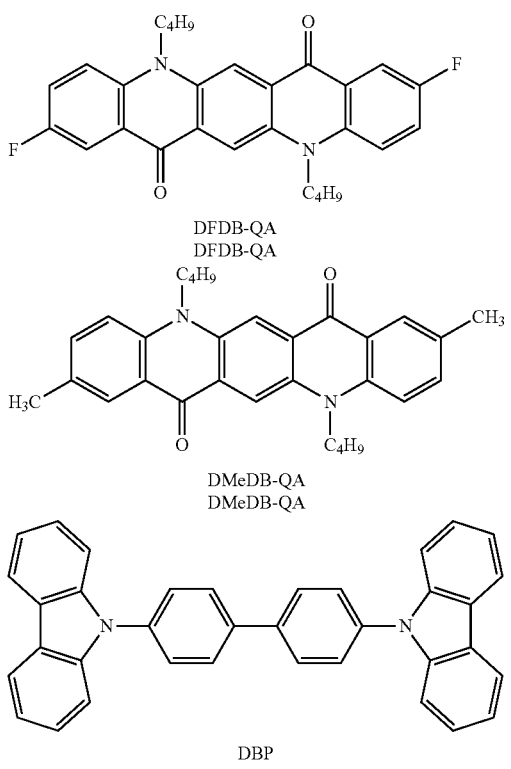

DFDB-QA
DFDB-QA

DMeDB-QA
DMeDB-QA

DBP

A popular method of optimizing quantum dot light-emitting devices is based on the injection and transport of carriers. For example, the structure of the device is optimized by selecting a suitable hole injection layer HIL, a hole transport layer HTL, an electron transport layer ETL and an electron injection layer EIL to improve the performance of the device.

TADF mechanism is a mechanism of using organic small molecular materials with small energy level difference between singlet state and triplet state ($\Delta E_{ST}$), and the triplet state excitons may be translated into singlet excitons through the process of reverse intersystem crossing (RISC) under ambient thermal energy. Theoretically, the internal quantum efficiency of the device can reach 100%. More specifically, if the TADF material for example is a host-guest doped material, the ratio of the singlet excited state and the triplet excited state generated in the TADF host material may be 1:3 in the case of electron injection. Under the action of ambient thermal energy, the triplet state excitons of the TADF host material with small energy level difference between singlet state and triplet state ($\Delta E_{ST}$) may be translated into singlet excitons through the process of reverse intersystem crossing (RISC). In the case that the TADF host material has a good energy matching relationship with the quantum dot light-emitting material, the dominant mechanism of energy transfer between the host molecule and the guest molecule is a long-range Foster type energy transfer, that is an energy transfer from a singlet state to a singlet state. Based on the above principle, the guest molecule may not only obtain an energy from the directly generated host singlet excited state, but also may obtain an energy from the triplet state excitons translated into singlet excitons through the process of reverse intersystem crossing (RISC), and in theory, the internal quantum efficiency may reach 100%. It can be seen that the exciton produced by TADF can transfer the energy to the quantum dot light-emitting layer, which may enhance the light-emitting ability of the quantum dots.

FIG. 1 is a schematic structure diagram of a quantum dot light-emitting device provided by an embodiment of the present disclosure. For example, the quantum dot light-emitting device comprises: a base substrate 100; a first electrode layer 101, a light-emitting layer 102, a second electrode layer 103 and an encapsulation layer 104 which are sequentially formed on the base substrate 100. The light-emitting layer 102 comprises a quantum dot light emitting material; a fluorescent material is disposed between the first electrode layer 101 and the second electrode layer 103, and the fluorescent material comprises a thermally activated delayed fluorescence (TADF) material; the first electrode layer 101 is an anode layer or a cathode layer, and the second electrode layer 103 is accordingly a cathode layer or an anode layer. In the present embodiment, the thermally activated delayed fluorescence (TADF) material is codoped with the quantum dot light-emitting material to form the light-emitting layer 102. The expression that the fluorescent material comprises a thermally activated delayed fluorescence material means that the fluorescent material at least comprises a thermally activated delayed fluorescence material, and it can further comprise other fluorescent materials.

Figure 2:
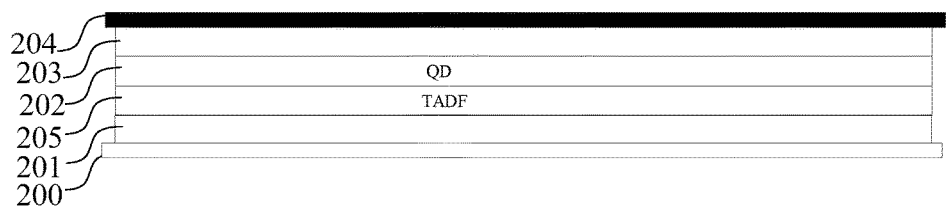
FIG. 2 is a schematic structure diagram of an OLED device provided by another embodiment of the present disclosure.

FIG. 2 is a schematic structure diagram of another quantum dot light-emitting device provided by an embodiment of the present disclosure. For example, the quantum dot light-emitting device comprises: a base substrate 200; a first electrode layer 201, an energy transfer layer 205, a light-emitting layer 202, a second electrode layer 203 and an encapsulation layer 204 which are sequentially formed on the base substrate 200. In the present embodiment, the light-emitting layer 202 is made of a quantum dot light-emitting material, and the energy transfer layer 205 contacted with the light-emitting layer 202 is made of a fluorescent material comprising a thermally activated delayed fluorescence (TADF) material.

Figure 3:
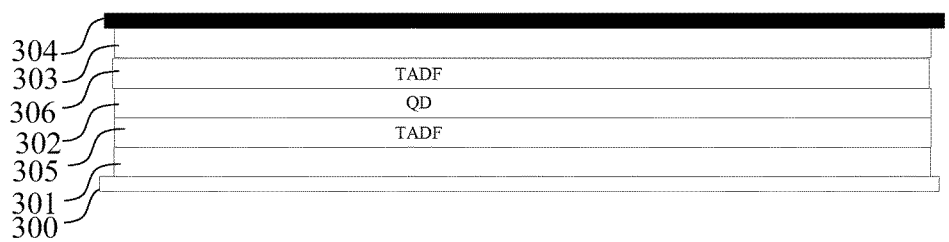
FIG. 3 is a schematic structure diagram of an OLED device provided by another embodiment of the present disclosure.

FIG. 3 is a schematic structure diagram of another quantum dot light-emitting device provided by an embodiment of the present disclosure. For example, the quantum dot light-emitting device comprises: a base substrate 300; a first electrode layer 301, a first energy transfer layer 305, a light-emitting layer 302, a second energy transfer layer 306, a second electrode layer 303 and an encapsulation layer 304 which are sequentially formed on the base substrate 300. In the present embodiment, the light-emitting layer 302 is made of a quantum dot light-emitting material, and the first energy transfer layer 305 and the second energy transfer layer 306 which are contacted with the light-emitting layer 302 are made of a fluorescent material comprising a thermally activated delayed fluorescence (TADF) material.

Figure 4:
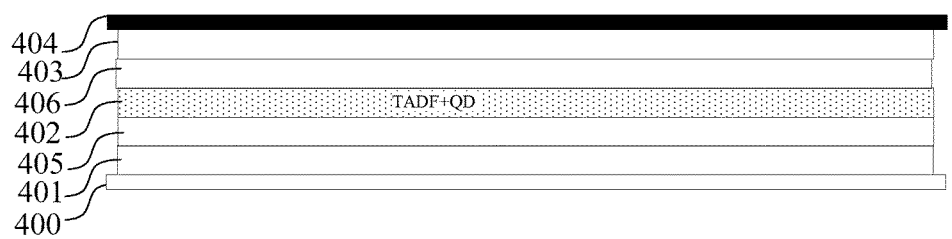
FIG. 4 is a schematic structure diagram of an OLED device provided by another embodiment of the present disclosure.

FIG. 4 is a schematic structure diagram of another quantum dot light-emitting device provided by an embodiment of the present disclosure. For example, the quantum dot light-emitting device comprises: a base substrate 400; a first electrode layer 401, a first energy transfer layer 405, a light-emitting layer 402, a second energy transfer layer 406, a second electrode layer 403 and an encapsulation layer 404 which are sequentially formed on the base substrate 400. In the present embodiment, a thermally activated delayed fluorescence (TADF) material is codoped with a quantum dot light-emitting material to form the light-emitting layer 402, and the first energy transfer layer 405 and the second energy transfer layer 406 which are contacted with the light-emitting layer 402 are made of the thermally activated delayed fluorescence (TADF) material.

Figure 5:
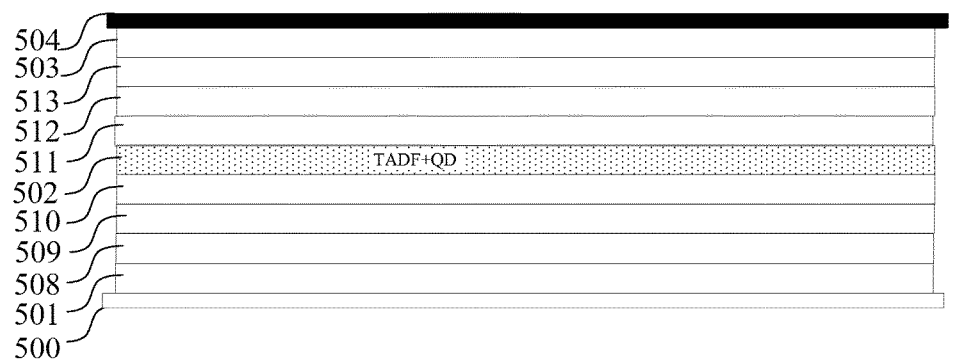
FIG. 5 is a schematic structure diagram of an OLED device provided by another embodiment of the present disclosure.

FIG. 5 is a schematic structure diagram of another quantum dot light-emitting device provided by an embodiment of the present disclosure. For example, the quantum dot light-emitting device comprises: a base substrate 500; a first electrode layer 501, a hole injection layer 508, a hole transport layer 509, a hole blocking layer 510, a light-emitting layer 502, an electron blocking layer 511, an electron transport layer 512, an electron injection layer 513, a second electrode layer 503 and an encapsulation layer 504 which are sequentially formed on the base substrate 500. In the present embodiment, a thermally activated delayed fluorescence (TADF) material is codoped with a quantum dot light-emitting material to form the light-emitting layer 502; the first electrode layer 501 is an anode layer and the second electrode layer 503 is a cathode layer. It should be understood that, the hole injection layer 508, the hole transport layer 509, the electron transport layer 512, the electron injection layer 513, the hole blocking layer 510, and the electron blocking layer 511 are optional, and they may be incorporated or removed according to the actual situations.

In the above embodiments, the thermally activated delayed fluorescence material may for example, be selected from compounds with $\Delta_{S,T}$<0.1 eV. In the above embodiments, the fluorescent material for example is composed of a single thermally activated delayed fluorescence material. For example, the thermally activated delayed fluorescence material may be 2,4,5,6-tetrakis(carbazol-9-yl)-1,3-dicyanobenzene (4CzIPN). Or, the thermally activated delayed fluorescence material may be a mixture comprising a host material and a guest material. For example, the host material comprises at least one of 4,5-bis(carbazol-9-yl)-1,2-dicyanobenzene (2-CzPN), (3'-(4,6-diphenyl-1,3,5-triazine-2-yl)-(1,1'-biphenyl)-3-yl)-9-carbazole (3-CzTRZ) and 2,5-bis(carbazol-9-yl)-1,4-dicyanobenzene (CzTPN), and the guest material comprises at least one of DFDB-QA and DMeDB-QA. Optionally, the fluorescent material may further comprise a fluorescent material having no thermally activated delayed fluorescence characteristic. For example, the host material comprises at least one of 4,5-bis(carbazol-9-yl)-1,2-dicyanobenzene (2-CzPN), (3'-(4,6-diphenyl-1,3,5-triazine-2-yl)-(1,1'-biphenyl)-3-yl)-9-carbazole (3-CzTRZ) and 2,5-bis(carbazol-9-yl)-1,4-dicyanobenzene (CzTPN); the guest material comprises at least one of DFDB-QA and DMeDB-QA, and the fluorescent material having no thermally activated delayed fluorescence characteristic comprises 4,4'-bis(N-carbazolyl)-1,1'-biphenyl (DBP).

In the above embodiments, the quantum dot light-emitting material may be selected from red quantum dots, green quantum dots and blue light quantum dots according to the actual situations. For example, the maximum luminous wavelength of the red quantum dots ranges from about 550 nm to about 650 nm; the maximum luminous wavelength of the green quantum dots ranges from about 480 nm to about 550 nm, and the maximum luminous wavelength of the blue quantum dots ranges from about 400 nm to about 480 nm. For example, the quantum dot light-emitting material is a zinc sulfide material with a core/shell structure.

The main role of the thermally activated delayed fluorescence material is to enhance the energy transferred to the quantum dot light emitting material. Therefore, the main criteria for selecting the thermally activated delayed fluorescence material is matching the energy level of the thermally activated delayed fluorescence material with the energy level of the quantum dot light-emitting material to make the energy transferred from the thermally activated delayed fluorescence material to the quantum dot light-emitting material more effective. For example, at least a portion of a fluorescence emission spectrum of the thermally activated delayed fluorescence material overlaps with an absorption spectrum of the quantum dot light emitting material, and the overlap area accounts for not less than about 30%, 40%, 50%, 60%, 70%, or 80% of an area of the fluorescence emission spectrum of the guest material.

In the above embodiments, the surface of the quantum dot light-emitting material is for example provided with a ligand, and the ligand is selected from a group consisting of a phosphate ligand, a thiol ligand and a carboxylic acid ligand. Because luminescence quenching may occur due to aggregation of quantum dots, providing the surface of the quantum dot light-emitting material with a ligand may effectively prevent the aggregation of quantum dots and improve the light-emitting efficiency, and also can slow down the decomposition of the quantum dot materials.

In the above embodiments, for example, a thickness of the energy transfer layer ranges from about 3 nm to about 80 nm, or a thickness of the energy transfer layer ranges from about 5 nm to about 50 nm, or a thickness of the energy transfer layer ranges from about 10 nm to about 30 nm. Setting the thickness of the energy transfer layer should aim at an efficient energy transfer. If the thickness of the energy transfer layer is too large, the excitons can not be effectively transferred to the quantum dot light-emitting material. If the thickness of the energy transfer layer is too small, the role of the energy transfer layer is limited.

In the above embodiments, the hole injection layer for example may be made of triphenylamine compounds or a p-type doped organic layer or polymers, such as tri[4-(5-phenyl-2-thiophene) phenyl] amine, 4,4',4"-tri[2-naphthyl (phenyl) amino] triphenylamine (2-TNATA) or 4,4',4"-tri(3-methyl phenyl aniline) triphenylamine (m-MTDATA), copper phthalocyanine (CuPc), Pedot: Pss, TPD, or F4TCNQ. The hole injection layer may have a thickness from about 1 nm to about 100 nm, or from about 10 nm to about 50 nm.

In the above embodiments, the hole transport layer, for example may be made of aromatic diamine compounds, triphenylamine compounds, aromatic triamine compounds, biphenyl diamine derivatives, triarylamine polymers or carbazole polymers, such as NPB, TPD, TCTA and polyethylene carbazole or its monomer. The hole transport layer may have a thickness from about 20 nm to about 200 nm, or from about 30 nm to about 80 nm.

In the above embodiments, the electron transport layer, for example may be made of phenanthroline derivatives, oxazole derivatives, thiazole derivatives, imidazole derivatives, metal complexes or anthracene derivatives. The specific examples comprise: 8-hydroxyquinoline aluminum ($Alq_3$), 8-hydroxyquinoline lithium (Liq), 8-hydroxyquinoline gallium, Bis[2-(2-hydroxyl phenyl-1)-pyridine] beryllium, 2-(4-biphenylyl)-5-(4-tert-butylphenyl)-1,3,4-oxadiazole (PBD), 1,3,5-tris(N-phenylbenzimidazol-2-yl) benzene (TPBI), BCP, Bphen, etc. The electron transport layer may have a thickness from about 20 nm to about 500 nm, or from about 50 nm to about 100 nm.

In the above embodiments, the electron injection layer, for example may be made of alkali metal oxides, alkali metal fluorides, etc. The alkali metal oxides include lithium oxide ($Li_2O$), lithium boron oxide (LiBO), potassium silicate ($K_2SiO_3$), cesium carbonate ($Cs_2CO_3$), etc. The alkali metal fluorides include lithium fluoride (LiF) and sodium fluoride (NaF), etc. The electron injection layer may have a thickness from about 0.5 nm to about 3 nm.

At least one embodiment of the present disclosure further provides a display substrate, and the display substrate comprises a plurality of the above-mentioned quantum dot light-emitting devices which are arranged in an array. At least one embodiment of the present disclosure further provides a display apparatus, and the display apparatus comprises the above-mentioned display substrate.

At least one embodiment of the present disclosure further provides a method for fabricating a quantum dot light-emitting device, and the method comprises: providing a base substrate; and forming a first electrode layer, a light-emitting layer, a second electrode layer and an encapsulation layer sequentially formed on the base substrate; wherein the light-emitting layer comprises a quantum dot light emitting material. The method may further comprise disposing a fluorescent material between the first electrode layer and the second electrode layer, wherein the fluorescent material comprises a thermally activated delayed fluorescence (TADF) material; the first electrode layer is an anode layer or a cathode layer, and accordingly the second electrode layer is a cathode layer or an anode layer.

In the above-mentioned method, for example, disposing a fluorescent material between the first electrode layer and the second electrode layer comprises at least one of the following two conditions: the fluorescent material is codoped with the quantum dot light-emitting material to form the light-emitting layer; and the fluorescent material forms an energy transfer layer at one side or both sides of the light emitting layer, and the energy transfer layer is in contact with the light-emitting layer.

In the above embodiments, each layer of the quantum dot light-emitting device can be manufactured by conventional methods. For example, the anode layer, the hole injection layer, the hole transport layer, the light-emitting layer, the electron transport layer, the electron injection layer and the cathode layer can be deposited by solutions. Appropriate solvents are selected, another layer is deposited on one layer, and the previously deposited layer can be protected from being destroyed. The deposition method may be carried out by for example, spin coating, spraying or printing, as well as sputtering, electron beam evaporation, vacuum evaporation or chemical vapor deposition.

The following is an example to further illustrate the fabrication process of a quantum dot light-emitting device provided by an embodiment of the present disclosure.

The structure of the device is:

[ITO/PEDOT:PSS/poly-TPD/PVK/DPEPOCz:FIrpic: QD/ZnO/LiF/Al]

The fabrication steps comprise:

1) cleaning a glass substrate provided with a ITO transparent electrode (anode):

washing it with deionized water and ethanol, treating it with ultrasonic for 20 minutes, then drying it quickly by a nitrogen air gun, then treating it with ozone for 10 minutes to clean the surface of the ITO and enhance the work function of the ITO electrode;

2) fabricating a hole injection layer:

spin coating PEDOT:PSS onto the clean glass substrate in the air with a rotational speed of 3500 rpm/minute, and the duration of spin coating is 45 s. After spin coating, annealing in the air at a temperature of 120° C. for 20 minutes, and drying the liquid that has not been volatilized;

3) fabricating a hole transport layer:

transferring the glass substrate into a glove box, spin coating a poly-TPD solution (the concentration of the poly-TPD solution is 10 mg/ml) onto the PEDOT:PSS layer with a rotational speed of 2500 rpm/minute, and the duration of spin coating is 45 s. After spin coating, annealing at a temperature of 110° C. for 30 minutes in the box to form a poly-TPD layer;

4) fabricating a hole blocking layer:

spin coating a PVK solution (the concentration of the PVK solution is 2 mg/ml) onto the poly-TPD layer with a rotational speed of 2000 rpm/minute, and the duration of spin coating is 45 s. After spin coating, annealing at a temperature of 170° C. for 30 minutes in the box to form a PVK layer;

5) fabricating a light-emitting layer:

making the light-emitting layer by codoping of DPEPOCz: FIrpic:QD, wherein a TADF system is formed by DPEPOCz:FIrpic for generating excitons, and the exciton energy is transferred to the quantum dot light-emitting material;

6) fabricating an electron transport layer:

spin coating a ZnO solution (the concentration of the ZnO solution is 30 mg/ml) on the EML layer with a rotational speed of 2000 rpm/minute, and the duration of spin coating is 45 s;

7) fabricating an electron injection layer:

after spin coating, putting the device into a vacuum evaporation chamber for vapor deposition of LiF;

8) fabricating a cathode:

conducting vapor deposition of cathode aluminum onto the LiF layer to obtain the quantum dot light-emitting device.

The embodiment described above is illustrative only and not limitative to the protection scope of the disclosure. The protection scope of the disclosure is defined by the accompanying claims.

The present application claims the priority of the Chinese Patent Application No. 201610091388.X filed on Feb. 18, 2016 and the Chinese Patent Application No. 201610237544.9 filed on Apr. 15, 2016, which are incorporated herein by reference as part of the present application.

What is claimed is:

1. A quantum dot light-emitting device, comprising:
   a base substrate; and
   a first electrode layer, a light-emitting layer, a second electrode layer and an encapsulation layer which are sequentially formed on the base substrate,
   wherein the light-emitting layer comprises a quantum dot light-emitting material;
   a fluorescent material is disposed between the first electrode layer and the second electrode layer;
   one of the first electrode layer and the second electrode layer is an anode layer, and the other of the first electrode layer and the second electrode layer is a cathode layer;
   wherein the fluorescent material comprises a thermally activated delayed fluorescence material; and
   at least a portion of a fluorescence emission spectrum of the thermally activated delayed fluorescence material overlaps an absorption spectrum of the quantum dot light-emitting material, and an overlap area accounts for not less than 30% of an area of the fluorescence emission spectrum of guest material.

2. The quantum dot light-emitting device according to claim 1, wherein the quantum dot light-emitting device satisfies at least one of the following two conditions:
the fluorescent material is codoped with the quantum dot light-emitting material to form the light-emitting layer; and
the fluorescent material forms an energy transfer layer on one side or on both sides of the light-emitting layer, and the energy transfer layer is in contact with the light-emitting layer.

3. The quantum dot light-emitting device according to claim 1, wherein the fluorescent material is composed of a single thermally activated delayed fluorescence material.

4. The quantum dot light-emitting device according to claim 3, wherein the single thermally activated delayed fluorescence material is 2,4,5,6-tetrakis(carbazol-9-yl)-1,3-dicyanobenzene (4CzIPN).

5. The quantum dot light-emitting device according to claim 1, wherein the thermally activated delayed fluorescence material is a mixture comprising a host material and the guest material.

6. The quantum dot light-emitting device according to claim 5, wherein the fluorescent material further comprises a fluorescent material having no thermally activated delayed fluorescence characteristic.

7. The quantum dot light-emitting device according to claim 6, wherein
the host material comprises at least one of 4,5-bis(carbazol-9-yl)-1,2-dicyanobenzene (2-CzPN), (3'-(4,6-diphenyl-1,3,5-triazine-2-yl)-(1,1'-biphenyl)-3-yl)-9-carbazole (3-CzTRZ) and 2,5-bis(carbazol-9-yl)-1,4-dicyanobenzene (CzTPN);
the guest material comprises at least one of DFDB-QA and DMeDB-QA; and
the fluorescent material having no thermally activated delayed fluorescence characteristic comprises 4,4'-bis(N-carbazolyl)-1,1'-biphenyl (DBP).

8. The quantum dot light-emitting device according to claim 1, wherein the quantum dot light-emitting material comprises at least one kind of red quantum dots, green quantum dots and blue light quantum dots.

9. The quantum dot light-emitting device according to claim 8, wherein a maximum luminous wavelength of the red quantum dots ranges from about 550 nm to about 650 nm, a maximum luminous wavelength of the green quantum dots ranges from about 480 nm to about 550 nm, and maximum luminous wavelength of the blue quantum dots ranges from about 400 nm to about 480 nm.

10. The quantum dot light-emitting device according to claim 1, wherein the quantum dot light-emitting material is a zinc sulfide material with a core/shell structure.

11. The quantum dot light-emitting device according to claim 1, wherein a surface of the quantum dot light-emitting material is provided with a ligand which is selected from a group consisting of a phosphate ligand, a thiol ligand and a carboxylic acid ligand.

12. The quantum dot light-emitting device according to claim 1, wherein the thermally activated delayed fluorescence material forms an energy transfer layer on one side or on both sides of the light-emitting layer; the energy transfer layer is in contact with the light-emitting layer; and the energy transfer layer has a thickness of from about 3 nm to about 80 nm.

13. The quantum dot light-emitting device according to claim 1, further comprising at least one of the following two structures:
a hole injection layer, a hole transport layer and a hole blocking layer which are sequentially disposed between the anode layer and the light-emitting layer; and
an electron injection layer, an electron transport layer and an electron blocking layer which are sequentially disposed between the cathode layer and the light-emitting layer.

14. The quantum dot light-emitting device according to claim 1, wherein the base substrate is an array substrate, and the anode layer is electrically connected with a switch element of the array substrate.

15. A display substrate, comprising quantum dot light-emitting devices according to claim 1, wherein the quantum dot light-emitting devices are arranged in an array.

16. A method for fabricating a quantum dot light-emitting device, comprising:
providing a base substrate; and
forming a first electrode layer, a light-emitting layer, a second electrode layer and an encapsulation layer sequentially on the base substrate, wherein the light-emitting layer comprises a quantum dot light-emitting material;
and the method further comprises disposing a fluorescent material between the first electrode layer and the second electrode layer, wherein one of the first electrode layer and the second electrode layer is an anode layer, and the other of the first electrode layer and the second electrode layer is a cathode layer;
wherein the fluorescent material comprises a thermally activated delayed fluorescence material; and
at least a portion of a fluorescence emission spectrum of the thermally activated delayed fluorescence material overlaps an absorption spectrum of the quantum dot light-emitting material, and an overlap area accounts for not less than 30% of an area of the fluorescence emission spectrum of guest material.

17. The method according to claim 16, wherein disposing the fluorescent material between the first electrode layer and the second electrode layer comprises at least one of the following two conditions:
the fluorescent material is codoped with the quantum dot light-emitting material to form the light-emitting layer; and
the fluorescent material forms an energy transfer layer on one side or on both sides of the light-emitting layer, and the energy transfer layer is in contact with the light-emitting layer.

* * * * *